Dec. 28, 1965 W. B. BACHELOR 3,226,660

PULSE-AMPLITUDE DISCRIMINATING PASSIVE DELAY FILTER USEFUL AT AMPLIFIER INPUT TO INCREASE DYNAMIC RANGE

Filed Jan. 31, 1963

INVENTOR.
WILLIAM BRUCE BACHELOR
BY Glenn S Orevik Agent
Richard C Reed
ATTORNEY United States Patent Office 3,226,660
Patented Dec. 28, 1965

3,226,660

PULSE-AMPLITUDE DISCRIMINATING PASSIVE DELAY FILTER USEFUL AT AMPLIFIER INPUT TO INCREASE DYNAMIC RANGE

William Bruce Bachelor, Oxon Hill, Md., assignor to the United States of America as represented by the Secretary of the Navy Filed Jan. 31, 1963, Ser. No. 255,414
3 Claims. (Cl. 333—20)
(Granted under Title 35, U.S. Code (1952), sec. 266)

The invention described herein may be manufactured and used by or for the Government of the United States of America for governmental purposes without the payment of any royalties thereon or therefor.

This invention relates in general to limited bandwidth pulse circuit coupling means and in particular to pulse rise time control means.

In selected pulse circuitry it is often desirable to provide a means for limiting the rise time of the pulse while preserving amplitude information. In such selective circuitry it may be desirable, for example, to increase the effective dynamic range of operation of a limited bandwidth amplifier without increasing its bandwidth or voltage excursions.

A common practice in the prior art is to employ instantaneous automatic gain control circuits to accomplish these ends, but speed of operation is a serious limiting factor in many applications. Logarithmic amplifiers avoid some of the speed limitation disadvantages of automatic gain control circuits but as the name indicates, produce outputs having a logarithmic relationship to the input which requires supplemental signal conversion means in many applications where the original pulse shape must be maintained. It will be appreciated that a pulse rise time control means which does not substantially distort pulse shape and operates at a considerably faster rate, that is, which responds to much shorter pulses, is needed and would be welcomed as a substantial advancement of the art.

Accordingly, it is an object of this invention to provide a pulse rise time control means which preserves input pulse amplitude information.

It is also an object of this invention to provide a pulse rise time control means which is relatively fast acting.

It is a further object of this invention to provide a pulse rise time control means which can be utilized to increase the effective dynamic range of operation of a limited bandwidth amplifier without increasing its bandwidth or voltage excursions.

It is another object of this invention to provide a pulse rise time control means which is suitable for comparison of the relative amplitudes of pulses obtained through two or more channels when the pulses in each channel are identical except for amplitude.

Figure 1:
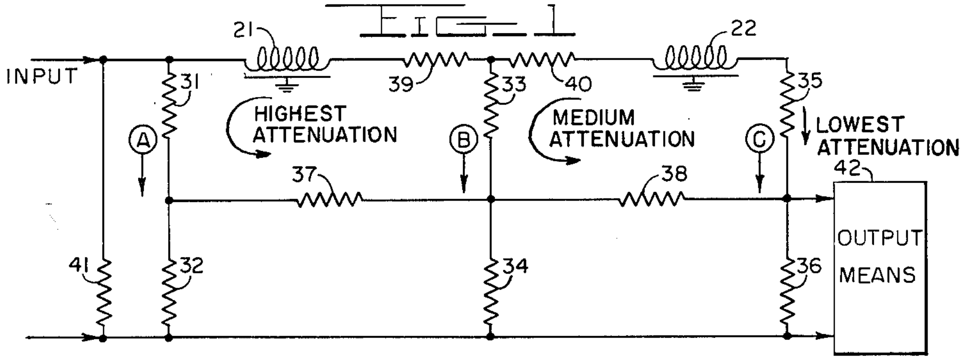

Other objects of the invention will become apparent upon a more comprehensive understanding of the invention in which reference is had to the following specification and drawings:

FIG. 1 is a schematic diagram of one embodiment of the device of this invention.

Figure 2:
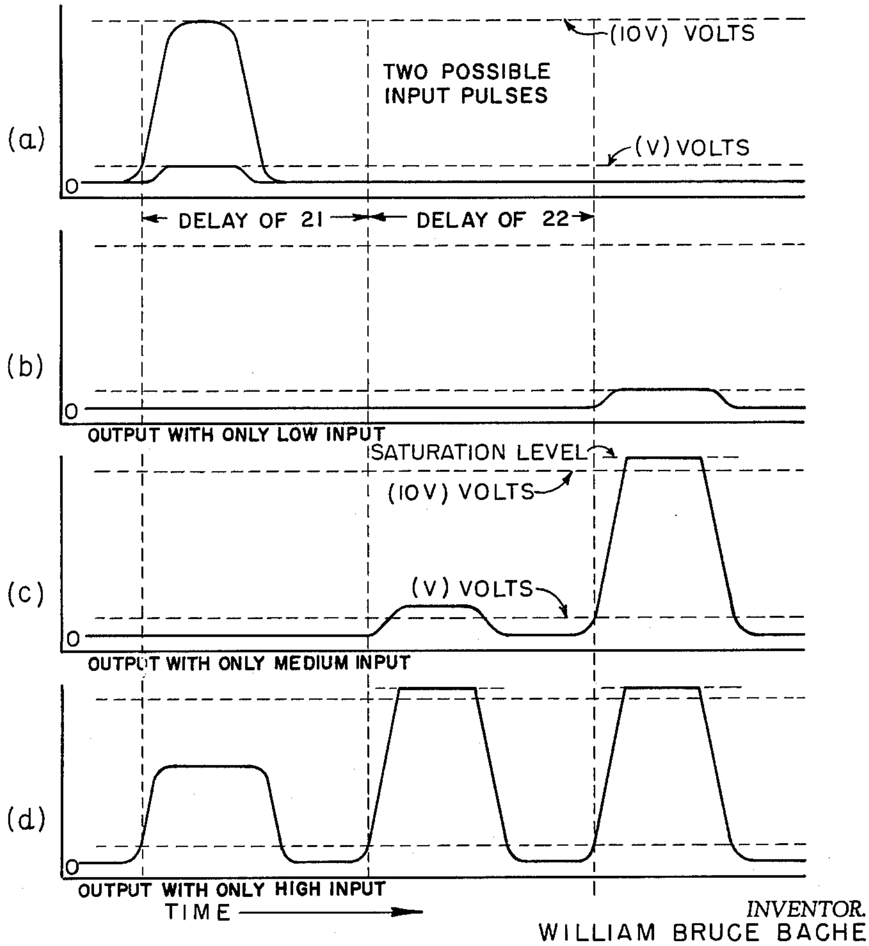

FIGS. 2*a*, *b*, *c*, and *d* are a graphical presentation of input and output pulse signals with and without the device of this invention.

Briefly, the device of this invention is an interstage coupling means which may include amplification means wherein delay components are employed to separate input signals by amplitude. In the exemplary embodiment the device incorporates static components exclusively and is adaptable to the design of a great number of electronic circuits.

A practical embodiment of the invention in a relatively basic form is illustrated in FIG. 1. This embodiment constitutes a multisection resistance impedance network with the several sections thereof coupled via respective signal delay elements 21 and 22 which in this embodiment may be distributed constant delay lines of any conventional variety. For purposes which will become apparent hereinafter, series connected resistances 31 and 32 of the first section are, for example, in a 10 to 1 relation, such as 2400 and 240 ohms, respectively, series connected resistances 33 and 34 of the second section are, for example, in a 2 to 1 relation, such as 2400 and 1100 ohms, respectively, and series connected resistances 35 and 36 of the third section are, for example, in a 1 to 4 relation, such as 560 and 2400 ohms, respectively. Resistances 37 and 38 serve to interconnect the midpoint of each series resistance section and may be 2000 ohms each, for example. Matching resistances 39 and 40 are not essential to the basic concept of the device of this invention but may be employed, as shown, in conjunction with 21 and 22 for front and back matching purposes. In such instance, for delay line elements having a characteristic impedance of, for example, 1.8K ohms and a delay of 0.5 microsecond, the resistances 39 and 40 might be 510 ohms.

The input signal is applied directly across the first section, the resistance 41 representing the output impedance of the input means. Output means 42, having a selected dynamic range of operation is connected across the resistance 36 to receive the input signal via the several sections of the coupling network.

It will be appreciated that the resistance values mentioned above are merely typical of one operative embodiment and that these values may be adjusted as necessary in selected applications. Moreover, in many applications, the resistance values are not critical and ordinary 5% tolerance carbon resistances may be employed.

In operation of the embodiment of FIG. 1, a pulsed signal, for example, or a pulsed video signal, is applied across the input impedance 41 which might be 6800 ohms. This input signal makes its way to the output via the first, second, and third sections referred to above, as indicated at *a*, *b*, and *c*, respectively. Impedance values of the network are so designed that the contribution to the output signal that passes through the third section, indicated at *c*, is approximately 16.6 db greater than that contribution that passes through the second section, indicated at *b*. Similarly, the network design is such that the contribution that passes through the second section also is 16.6 db greater than that contribution which passes through the first section, indicated at *a*.

In terms of attenuation, the signal which passes through the third section is attenuated to the least possible degree. The maximum degree of attenuation of the signal which passes through the second section is determined by the dynamic range of operation of the output means 42, that is, in the case of an output amplifier, for example, that input signal voltage range within which the gain of the amplifier is linear. In accordance with this invention, the ratio of attenuation of the signal which passes through the third section and of that which passes through the second section must be no greater than the dynamic range of the output means. Likewise, the ratio of attenuation of the signal which passes through the second section and that which passes through the first section must be no greater than the dynamic range of the output means.

In accordance with the invention, the portion of the input which passes through the first section is not delayed to a significant degree, the portion of the input which passes through the second section is delayed a first selected time interval and the portion of the input which passes through the third section is delayed a second selected time interval substantially twice the first selected time interval.

FIGS. 2*a*, *b*, *c*, and *d* illustrate the operation of the embodiment depicted in FIG. 1 and are indicative of its widespread usefulness. For purposes of illustration, an output system, perhaps an amplifier and a readout means, having a usable dynamic range of 20 decibels, a minimum step response $\gamma$, and a minimum usable signal level of ($v$), is assumed. FIG. 2*a* merely illustrates minimum and maximum limits.

FIG. 2*b* illustrates the case wherein the input level to the device of this invention is increased to compensate for the attenuation occurring through the third section. It will be noted that the minimum usable pulse is passed substantially unchanged except for being delayed through the two delay lines 21 and 22.

FIG. 2*c* illustrates the case wherein the input level is further increased at least to the point when the third section becomes satuarted, for instance, more than 20 db. It will be noted that the output obtained through the second section rises to an amplitude within the operating range of the amplifier and that, due to the fact that only one delay element 21 is involved, this component of the output can be singularly observed in the readout means before the third section component of the output arrives.

Similarly, as seen in FIG. 2*d*, still stronger and undelayed signal components through the first section can be passed substantially undistorted by the amplifiers in the output system and can be singularly observed before the second and third section components of the output signal arive. FIG. 2*d* illustrates the output after approximately 45 db increase with respect to the showing in FIG. 2*b*.

In the exemplary embodiment of this invention, the effective dynamic range of operation of the system was increased from 20 to 53 db and the pulse rise time was maintained constant within the limits of the output amplifier system. It will be seen that the device of this invention is readily adaptable to the comparison of the relative amplitudes of pulses obtained through two or more channels. The device has particular utility in any application involving amplitude responses to triggering devices which require a pulse trigger signal having a relatively sharp leading edge.

It is understood, of course, that the device of this invention is not restricted to the two delay embodiment shown, that it is within the purview of this disclosure to change the number of sections, the increment of attenuation between sections, and the delay between sections, if desired.

Moreover, it is within the purview of this disclosure to provide gain between sections instead of a progressively less loss as in the exemplary embodiment.

The inherent complexities of intersection amplifiers such as coupling difficulties, possible regenerative feedback complications, and soon, must be considered, of course, and may complicate but not preclude the incorporation thereof in applications where minimum size, weight, power drain, etc., are critical features.

Finally, it is understood that this invention is to be limited only by the scope of the claims appended hereto.

What is claimed is:

1. A pulse circuit coupling means comprising a plurality of $n$ voltage divider sections including an input section and an output section, each of said voltage dividers in said plurality thereof having a first and second portion in serial connection and a junction point therebetween, a plurality of $n$ signal delay means, said signal delay means electrically connected in series and each adapted to interconnect the first portion end of two respective voltage divider sections in said plurality thereof, means electrically connecting the second portion end of each of said voltage divider sections in said plurality thereof in common, means for applying pulse signals of different amplitude across said input section of said plurality of voltage dividers, output pulse utilization means having a selected dynamic range of operation, means connecting said output pulse utilization means across said second portion of said output section of said plurality of voltage dividers, and isolation impedance means connecting said output pulse utilization means across said second portion of the remainder of said voltage dividers in said plurality thereof such that an input to output signal path with predetermined attenuation and substantially no delay, at least one other input to output signal path with a lesser predetermined attenuation and predetermined delay, and another input to output signal path with minimum attenuation and a predetermined delay are obtained, the cumulative attenuation of all of said signal paths having said predetermined attenuation with respect to the attenuation of said path having said minimum attenuation being in a selected ratio within said dynamic range of operation of said output pulse utilization means.

2. The amplitude modulated pulse circuit coupling means as defined in claim 1 wherein said isolation impedance means are electrically connected in series and are each adapted to interconnect said junction point of two voltage divider sections in said plurality thereof.

3. The amplitude modulated pulse circuit coupling means as defined in claim 2 wherein said plurality of $n$ voltage divider sections comprises three sections.

References Cited by the Examiner

UNITED STATES PATENTS

| | | | |
|---|---|---|---|
| 2,759,044 | 8/1956 | Oliver | 333—70 |
| 2,848,613 | 8/1958 | Green | 307—88.5 |
| 2,912,601 | 11/1959 | Slatten | 328—58 |
| 3,068,417 | 12/1962 | Fiske | 328—58 |

HERMAN KARL SAALBACH, *Primary Examiner.*

A. R. MORGANSTERN, *Assistant Examiner.*